United States Patent
Call et al.

(10) Patent No.: US 6,300,164 B1
(45) Date of Patent: Oct. 9, 2001

(54) STRUCTURE, MATERIALS, AND METHODS FOR SOCKETABLE BALL GRID

(75) Inventors: Anson J. Call, Poughkeepsie; Stephen Anthony DeLaurentis, Claverack; Shaji Farooq, Hopewell Junction; Sung Kwon Kang, Chappaqua; Sampath Purushothaman, Yorktown Heights; Kathleen Ann Stalter, Hopewell Junction, all of NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/559,314

(22) Filed: Apr. 27, 2000

Related U.S. Application Data

(62) Division of application No. 09/106,779, filed on Jun. 30, 1998.
(60) Provisional application No. 60/052,094, filed on Jul. 10, 1997.

(51) Int. Cl.[7] .................................................. H01L 21/44
(52) U.S. Cl. .................. 438/108; 438/118; 438/119; 438/612; 438/613; 438/614; 438/618; 438/455; 228/180.2
(58) Field of Search ................................ 438/108, 118, 438/119, 455, 612, 613, 614, 618; 228/180.22

(56) References Cited

U.S. PATENT DOCUMENTS

| | | | |
|---|---|---|---|
| 3,839,727 | 10/1974 | Herdzik et al. | 357/71 |
| 4,701,482 | 10/1987 | Itoh et al. | 523/435 |
| 5,060,844 | 10/1991 | Behun | 228/180.2 |
| 5,062,896 | 11/1991 | Huang et al. | 106/287.19 |
| 5,134,460 | 7/1992 | Brady et al. | 357/71 |
| 5,137,845 | * 8/1992 | Lochon et al. | 437/183 |
| 5,147,084 | 9/1992 | Behun et al. | 228/56.3 |
| 5,237,130 | * 8/1993 | Kulesza et al. | 174/260 |
| 5,241,133 | 8/1993 | Mullen, III et al. | 174/52.4 |
| 5,258,577 | 11/1993 | Clements | 174/88 R |
| 5,328,087 | 7/1994 | Nelson et al. | 228/175 |
| 5,355,283 | * 10/1994 | Marrs et al. | 361/760 |
| 5,367,765 | 11/1994 | Kusaka | 29/840 |
| 5,420,460 | 5/1995 | Massingill | 257/693 |
| 5,445,308 | 8/1995 | Nelson et al. | 228/121 |
| 5,459,287 | 10/1995 | Swamy | 174/266 |
| 5,591,941 | 1/1997 | Acocella et al. | 174/266 |
| 5,604,379 | 2/1997 | Mori | 257/738 |
| 5,611,140 | 3/1997 | Kulesza et al. | 29/832 |
| 5,634,268 | 6/1997 | Dalal et al. | 29/840 |
| 5,672,400 | 9/1997 | Hansen et al. | 428/40.1 |
| 5,672,913 | 9/1997 | Baldwin et al. | 257/737 |
| 5,681,647 | 10/1997 | Caillat | 428/209 |
| 5,714,252 | 2/1998 | Hogerton et al. | 428/344 |
| 5,729,896 | 3/1998 | Dalal et al. | 257/737 |
| 5,761,048 | 6/1998 | Trabucco | 361/760 |
| 5,762,259 | 6/1998 | Hubacher et al. | 228/180.22 |

(List continued on next page.)

Primary Examiner—Deborah Jones
Assistant Examiner—Stephen Stein
(74) Attorney, Agent, or Firm—Connolly Bove Lodge & Hutz; Daniel P. Morris

(57) ABSTRACT

A socketable ball grid array structure is disclosed which comprises mechanically rigid (compared to solder alloys) balls coated with noble contact metals joined to the chip carrier terminals by means of a novel electrically conducting adhesive. Because of the nature of the filler that includes conducting particles with a fusible coating and the appropriate selection of the polymer resin used in the adhesive, the balls are attached to the module in a compliant and resilient manner while leaving the majority of the bottom surface of the balls pristine. The array of balls can therefore be plugged into mating sockets in a printed circuit board forming a demountable contact. This facilitates easy removal of the socketable BGA from a board for repair or upgrade purposes as well as allows ease of plugging and unplugging of these BGA's into test and burn-in boards.

16 Claims, 2 Drawing Sheets

U.S. PATENT DOCUMENTS

| | | | |
|---|---|---|---|
| 5,783,461 | 7/1998 | Hembree | 438/17 |
| 5,796,591 | 8/1998 | Dalal et al. | 366/779 |
| 5,813,870 | 9/1998 | Gaynes et al. | 439/91 |
| 5,844,168 * | 12/1998 | Schueller et al. | 174/52.4 |
| 5,861,322 | 1/1999 | Caillat et al. | 438/107 |
| 5,864,470 | 1/1999 | Shim et al. | 361/777 |
| 5,868,304 | 2/1999 | Brofman et al. | 228/254 |
| 5,872,051 * | 2/1999 | Fallon et al. | 438/616 |
| 5,879,530 | 3/1999 | Caillat | 205/122 |
| 5,918,113 * | 6/1999 | Higashi et al. | 438/119 |
| 5,943,212 | 8/1999 | Horiuchi et al. | 361/704 |
| 5,953,589 | 9/1999 | Shim et al. | 438/106 |
| 5,958,590 * | 9/1999 | Kang et al. | 428/403 |
| 5,985,043 | 11/1999 | Zhou et al. | 148/24 |
| 5,985,456 | 11/1999 | Zhou et al. | 428/414 |
| 6,017,634 | 1/2000 | Capota et al. | 428/414 |
| 6,059,992 | 5/2000 | Kang | 265/143 |
| 6,114,413 | 9/2000 | Kang et al. | 428/403 |
| 6,120,885 * | 9/2000 | Call et al. | 428/209 |

* cited by examiner

STRUCTURE, MATERIALS, AND METHODS FOR SOCKETABLE BALL GRID

CROSS-REFERENCE TO RELATED APPLICATIONS

U.S. patent application Ser. No. 09/106,779 filed Jun. 30, 1998 which claims the benefit of U.S. Provisional Ser. No. 60/052,094 filed Jul. 10, 1997. This application contains subject matter that is also contained in U.S. Ser. No. 09/106, 780 entitled "Interconnections with Electrically Conductive Adhesives: Structures, Materials, Methods and Their Applications, filed on even date; and U.S. Ser. No. 09/107, 998 entitled "Structure, Materials and Applications of Ball Grid Array Interconnections", filed on even date; disclosures of which are incorporated herein by reference.

TECHNICAL FIELD

The present invention relates generally to techniques for connecting an electronic device to external circuitry, and more particularly to socketable ball grid array interconnections between microelectronic packages and printed circuit boards. In particular, it relates to ball grid arrays that can be readily demounted from the printed wiring board they are assembled on to.

BACKGROUND OF INVENTION

Rapid advances in microelectronic devices are continuously demanding finer pitch connections between electronic chip carriers and printed circuit boards (on the order of a few hundred micrometer pitch or less). This demand as well as the demand for low cost electronic packages have led to the increased use of surface mount technology (SMT) over the conventional plated-through-hole (PTH) technology in the recent years. At present, more than two thirds of integrated circuits (IC) including both memory and logic devices are assembled by SMT. SMT packages commonly found in a PCB assembly are leaded chip carriers such as small outline integrated circuits (SOIC), plastic leaded chip carrier (PLCC), quad flat pack (QFP), thin small outline package (TSOP), or tape carrier package (TCP). These leaded chip carriers, mostly plastic packages, depend on a perimeter connection between an IC package and a printed circuit board (PCB). The perimeter connection scheme of SMT packages has reached its limitation in terms of connection pitch and I/O capability, particularly for high performance IC's.

To relieve the limitations of perimeter connections and thereby to increase the packaging density, area array connection schemes have become popular recently. Some of the area array packages developed for SMT include the ball grid array (BGA) package, solder column grid array (SCGA), direct chip attach (DCA) to PCB by flip chip connection, tape ball grid array (TBGA), or chip scale packages (CSP). Among them, BGA is currently the most popular one, where solder balls connect a module carrying an IC to a PCB. This technology is an extension of the controlled collapse chip connection (C4) scheme originally developed for solder bump connection of multiple chips to a ceramic substrate. The IC on the module can be connected to the module in several ways as taught by Mulles et al., U.S. Pat. No. 5,241,133; Massingill, U.S. Pat. No. 5,420,460; and Marrs et al., U.S. Pat. No. 5,355,283 among others. Ceramic or organic module substrates can be employed depending on the performance, weight and other requirements. The common feature, however, is that the connection between the IC carrier and the next level PCB is accomplished by an array of solder balls which are attached to the module by a solder alloy with a lower melting temperature. BGA packages have several advantages over the conventional leaded chip carriers; small and low profile package, large, standard pitch for the same I/O count, high assembly yield due to self-alignment, rugged package (no lead deformation), better electrical/thermal performance, and compatibility with SMT assembly process. A few drawbacks of BGA packages are noted such as difficulty of visual inspection of solder joints, difficulty in testing the BGA assembly without damage to the soft solder BGA balls, lack of easy demountability of BGA assembly from the PCB once assembled, cost issues of BGA modules, control of solder ball connection process, lack of field reliability data, and others.

As mentioned earlier, there are several options depending on the choice of module materials, such as plastic BGA, ceramic BGA, and tape BGA. Ceramic BGA is more expensive than plastic BGA, but it has a better proven reliability over the plastic BGA. However, one major weakness of ceramic BGA is the large mismatch of thermal coefficient of expansion (TCE) between a ceramic module and a polymeric PCB. This limits the maximum size of ceramic BGA module that can be mounted on a PCB, to about 32 mm on edge with the state-of-the-art technology. For a ball pitch of 50 mil, this BGA module can have about 625 I/O connections. Plastic BGA has an advantage over a ceramic BGA in terms of TCE mismatch because of a better materials compatibility between the module and substrate materials. Since most of the plastic BGA's have a perimeter connection to a chip by wire bonding, the overall packaging density is much lower than that of a ceramic BGA which could have an area array connection to a chip by flip chip or C4 technology.

Solder balls used in BGA are typically 90%Pb—37%Sn in composition for ceramic BGA, 63%Sn—37%Pb eutectic solder for plastic BGA. The solder balls are connected by reflowing Sn—Pb eutectic solder paste materials used in SMT soldering. During the assembly of ceramic BGA's, only the Sn—Pb eutectic solder paste is melted, not the solder balls of a high melting temperature. During the reflow process, several reactions occur simultaneously at the soldering interfaces: dissolution of terminal metallurgies such as Au or Cu into the molten Sn—Pb eutectic solder, formation of Sn-containing intermetallic phases, interdiffusion of Sn and Pb across the liquid-solid interface, void formation in the solidifying Sn—Pb eutectic solder paste materials, and others. These reactions would affect the joint integrity and could degrade the long-term reliability. In fact, most of these BGA assemblies tend to fail by thermal cycling fatigue with a failure locus predominantly localized at or near the low melt solder/BGA ball interface region.

Another problem associated with BGA modules is the difficulty in testing and burning in the assembly after a silicon die has been assembled on them. Although the die may have been tested prior to BGA assembly, the devices and circuitry have to be retested because of the additional temperature and handling exposures involved in the BGA assembly. This poses a problem because the only way to access the chip devices is through the BGA balls and establishing reliable contact for testing and burn in is difficult with the existing apparatus that is geared towards pin grid array modules. Even if alternate means could be designed to contact the BGA balls, these would most likely require mechanical pressure of pads or bed of nails type pin arrays on a test board against the balls. These approaches would be unreliable due to the softness of the BGA balls and the tenacious oxide present on their surface. Additionally, the application of pressure during the testing can deform or even dislodge the BGA balls causing yield loss. From a burn in perspective, one has to contend additionally with the possible reaction of the BGA ball with the test bed pads or pins at the elevated temperatures required for this purpose.

One printed wiring board scheme proposed in the prior art (Swamy, U.S. Pat. No. 5,459,287) may be able to partly address this problem. This patent suggests a structure on the board that results in a limited angular area of bonding between the BGA ball and a metallized blind via on the top surface of the board using a solder that melts at a lower temperature than the BGA ball. The structure is claimed to be a socketed BGA since the BGA is expected to be partially located in place by these blind vias. U.S. Pat. No. 5,459,287, however, does not teach the use of such a scheme for solving the problems described above. One could envision that the test and burn in board could be provided with the above configuration and the modules to be tested can be assembled on them as described above. After the completion of the test and burn in process, the modules can be removed from the test board by a thermal and mechanical means taking advantage of the limited area of wetting between the BGA ball and the board. The main limitation of using such an approach would be the perturbation of the BGA ball geometry and its surface composition by the process. Potential for mechanical damage and formation of defects in the ball/module interface due to these additional process steps is also quite high.

SUMMARY OF INVENTION

In view of the above, it seems desirable to modify the BGA structure to alleviate the thermal cycling induced failures at the module/ball interface and further provide a structure that is amenable to easy demounting so that module upgrade as well as testing and burn-in of BGA modules can be accomplished with ease and reliability. The present invention relates to a socketable ball grid array (SBGA) scheme that makes the above possible. In accordance with the present invention, a strong and compliant interconnection of BGA spheres to ceramic or plastic substrates is made possible. Moreover, the present invention makes it possible to provide a stable BGA joint structure which does not cause an excessive interdiffusion between solder balls and the joining solder paste and one in which bonding can be achieved with minimal intermetallic formation compared to the eutectic SnPb solder paste. Also, according to the present invention, a BGA structure which gives a longer fatigue life as compared to the BGA structure assembled with eutectic solder paste can be achieved. Furthermore, the present invention makes it possible to obtain a demountable BGA structure that can be plugged into and unplugged from sockets in test boards with minimal perturbation to the ball surfaces so as to facilitate component upgrade and test and burn in.

More particularly, an aspect of the present invention relates to a ball grid array assembly on a chip carrier module that is produced by disposing an electrically conducting adhesive on the appropriate terminal pads on the module, transferring and holding an array of conducting spheres in contact with the dispensed adhesive, and applying pressure and heat for a period of time to achieve bonding of the spheres to the module pads.

Another aspect of the present invention is a demountable ball grid array assembly produced as described above and wherein the ball used in the array is made of an electrically conducting and mechanically stiff material and provided with suitable noble metal coatings to enable the use of its free unbonded surface as pluggable connection into a matching socket in a second electronic device such as a printed circuit board assembly, a test and burn-in board or the like.

The preferred conducting adhesive for this purpose is a conductive material formed from a plurality of particles, each having an electrically conductive coating which is fused to an electrically conductive coating on an adjacent particle to form a network of fused particles contained within a matrix of adhesive polymer. This adhesive provides a superior joint strengths and contact resistance values as compared to silver filled conducting epoxies. It is particularly suited for bonding to solder, copper, nickel, palladium, platinum or gold surfaces.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BRIEF DESCRIPTION OF THE DRAWINGS

Further objects, features, and advantages of the present invention will become apparent from a consideration of the following detailed description of the invention when read in conjunction with the drawing FIGs., in which.

Best and Various Modes for Carrying Out Invention

In order to facilitate an understanding of the present invention, reference will be made to FIG. 3.

Figure 1:
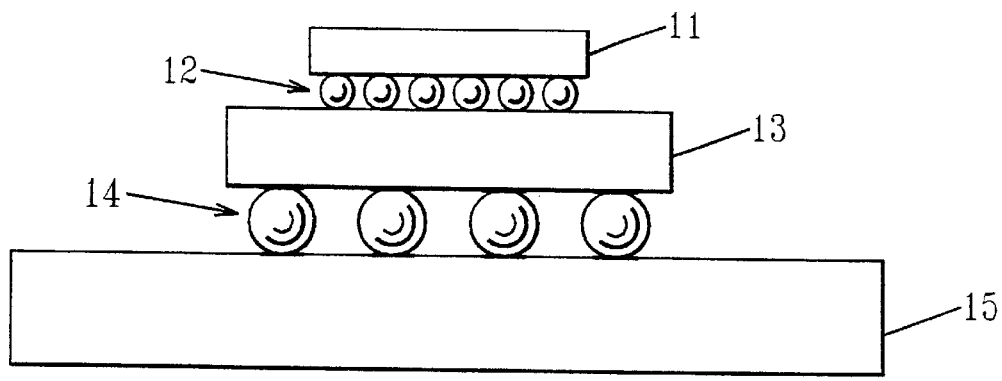
FIG. 1 is a schematic cross-sectional illustration representing a prior art ceramic ball grid array (BGA) module mounted on a PCB, while an IC chip is also connected to the module by flip chip solder bumps.
Figure 2:
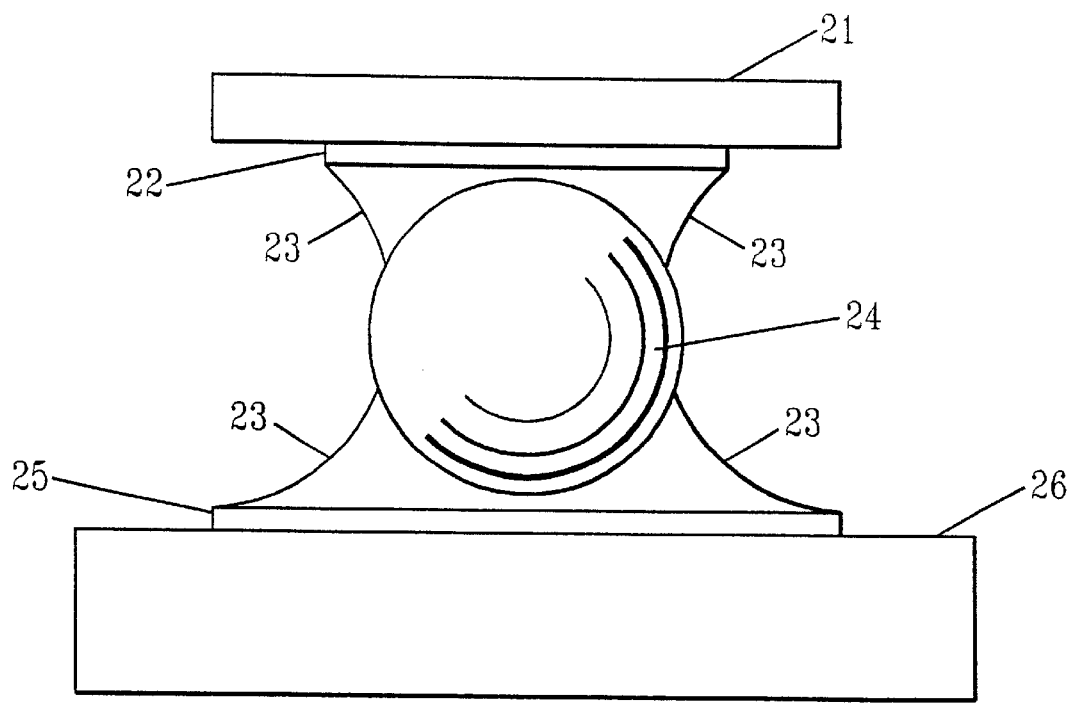
FIG. 2 is a schematic cross-sectional illustration representing a typical prior art solder ball connection in a ceramic BGA, where a high Pb solder ball connects a module to a PCB by melting Pb—Sn eutectic solder paste.
Figure 3:
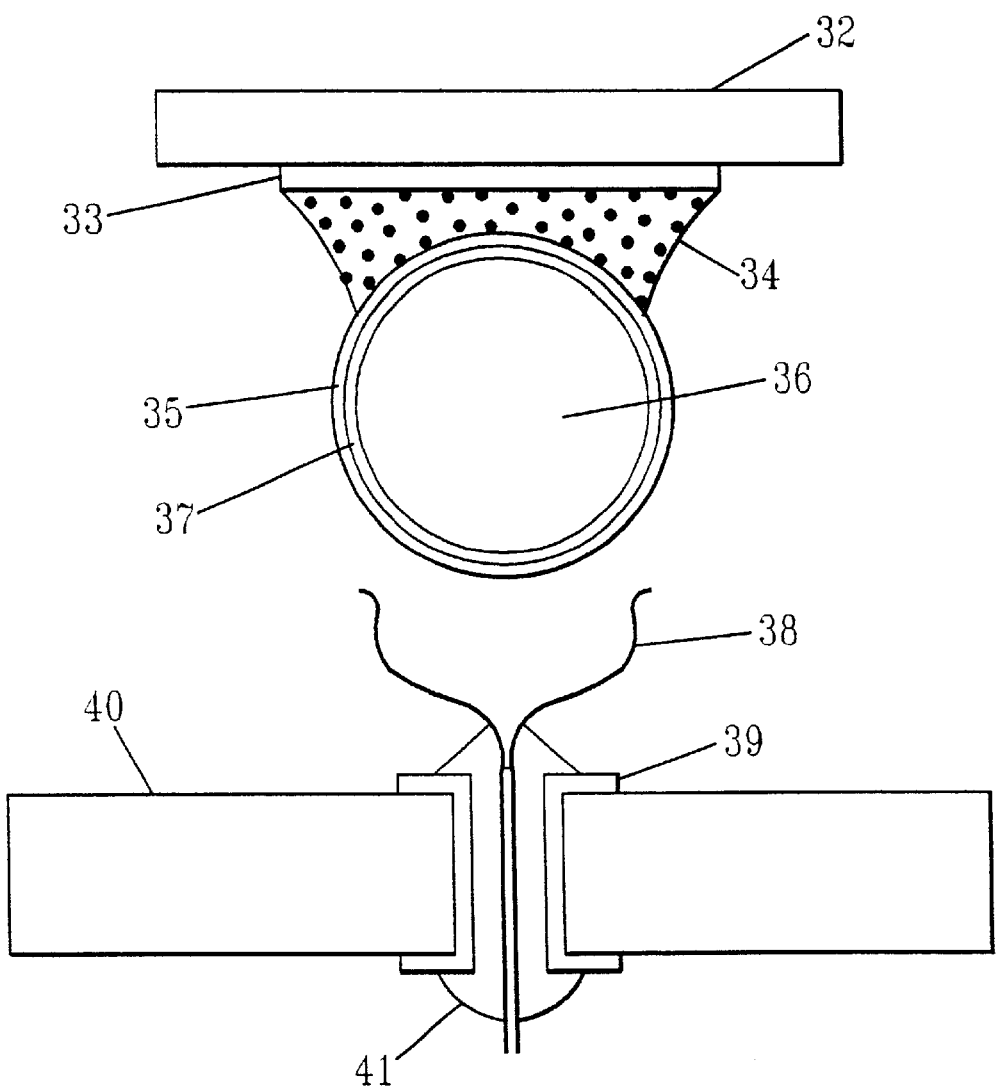
FIG. 3 is a schematic cross-sectional illustration representing a new solder ball connection scheme in a ceramic BGA, where a stiff and electrically conductive ball is connected to the module using an electrically conductive paste material.

In a preferred embodiment of the present invention, schematically shown in FIG. 3, the electrically conducting adhesive (ECA) is prepared by mixing a conducting powder filler, for example copper coated with a fusible material such as tin, with a thermoplastic polymer resin, such as polyimide siloxane, and a small amount of no-clean flux as taught in our previous patent application U.S. Ser. No. 08/641,406, disclosure of which is incorporated herein by reference. The mixture is homogenized using a three roll shear mill to ensure uniform dispersion of the powder in the polymer.

Examples of suitable electrically conductive adhesives 34 are disclosed in U.S. Ser. No. 08/641,406; U.S. Ser. No. 08/883,188; U.S. Ser. No. 60/052,172; U.S. Ser. No. 08/868,771 and U.S. Ser. No. 08/877,991, all of which are assigned to International Business Machines Corporation, the assignee of the present application, and entire disclosures of which are incorporated herein by reference.

These electrically conductive paste materials comprise conducting filler particles dispersed in a matrix of thermoplastic and/or thermoset polymer resin optionally with other ingredients. The electrically conducting adhesive preferably comprises:

a thermoplastic or thermoset polymer resin matrix, no-clean solder flux, and a plurality of electrically conducting particles with an electrically conducting fusible coating with at least some of the conducting particles being fused to other of the conducting particles through the electrically conductive fusible coating.

Preferably, the conducting particles are about 1 to about 50 micrometers in diameter. Preferably the electrically conducting fusible coating layer is about 0.1 to about 2 micrometers in thickness.

Typical examples of suitable polymer resin matrix materials are polyimides, siloxanes, polyimide-siloxanes, phenoxy polymers, styrene allyl alcohol polymers, epoxies and bio-based polymeric resins derived from at least one member of lignin, cellulose, wood oil, crop oil, or mixtures thereof.

Typical electrically conducting particles are Cu, Au, Ag, Al, Pd, Pt, mixtures and alloys thereof.

Typical electrically conducting fusible coatings are Sn, Zn, In, Pb, Bi and Sb, or combinations thereof.

The ECA 34 is then applied on to the I/O pads 33 on the BGA side of a chip carrier 32, for example a multilayer ceramic substrate or a section of a printed circuit board, which has a chip attached to it. The ECA dispensing can be achieved by screen printing, screening through a stencil or by syringe dispensing. The module is then aligned and placed over an array of balls held in a suitable retention boat. The boat is typically made of an inert and thermally conducting material such as graphite. The balls 36 themselves are nominally made of copper to take advantage of its high electrical conductivity and relatively high modulus compared to the ECA and solder alloys. The surface of the copper balls could be coated with noble metal coatings 37/35, such as nickel, cobalt, palladium or silver or mixtures as the layer 37 and gold, nickel, palladium or platinum or mixtures thereof as layer 35 typical examples being Ni/Au, Pd/Au, Ni/Pd, Ni/Pt, Pt/Au or a combination thereof to provide a surface that is amenable to use as a contact interface in plug-in connections 38 in its pristine state, while being suitable for joining with the ECA. The pristine state mentioned is understood by those skilled in the art and includes surfaces free of oxide, tin and copper. The coatings on the copper balls 36 can be produced by electroless plating, immersion plating, electrolytic barrel plating, sputtering, evaporation or chemical vapor deposition means. The coatings 37 and 35 are typically about 100 nm to about 10,000 nm.

A nominal pressure is then applied to keep the ball array in intimate contact with the ECA and the assembly is heated to a suitable elevated temperature that will facilitate the melting of the fusible coating on the filler particles. Typically the temperature is about 30° C. above the melting point of the coating metal and the parts are held for a short dwell time to ensure uniform melting of the coating material. The assembly is then cooled to room temperature and removed from the boat. The polymer resin used in these ECA's is such that removal of any solvents and completion of any curing processes occur simultaneously during this joining cycle. An additional thermal process can be optionally used to ensure completion of the polymer processing as required.

The net result is a BGA module 32 wherein the hard metal spheres 36 are attached to the module by a network of coated powder filler particles fused metallurgically together to themselves and on to the module I/O pads 33. The polymer provides a compliant yet tough matrix that can accommodate local strains and stresses between the substrate and the ball array. Further, the ECA bonds to the BGA ball surface only where it is contacted unlike solder which tends to wet and wick up the ball surface. This results in a bonded ball whose free surface (that is not attached with the paste) is quite pristine and therefore suitable for use in a plug-in connector. Thus, the array can be plugged in to a second component such as a printed circuit board 40 that has a matching set of sockets, springs or open tulip-shaped receptacles 38 or the like to achieve acceptable electrical interconnections. The receptacles can be connected to the printed circuit board 40 by strong plated-through hole solder joints 41. Because the balls are harder than typical Pb—Sn alloy solder balls used in normal BGA arrays, the present modules can be mounted and demounted from the socket board several times without concerns of damage to the ball array. The compliant ECA joint is stronger than silver filled epoxy adhesives and would accommodate the insertion/removal induced forces. Further, since the paste material is more resilient than typical eutectic PbSn solder alloy, the ECA joint can also better withstand stresses due to thermal excursions experienced by the module in typical test and use environments. Since the amount of fusible metal available in the ECA is limited by the coating thickness, the extent of intermetallic formation would be much less than in the case of balls attached with eutectic PbSn paste. Absence of significant amounts of a contiguous phase of hard and brittle intermetallics in the ECA/BGA ball interface region as opposed to solder/BGA ball interface would also result in enhanced toughness under thermal cycling conditions.

By way of a particular example, a specific composition embodiment disclosed in U.S. Ser. No. 08/641,406 relates to an electrically conductive paste made of tin-coated copper powder, polyimide-siloxane, solvent, carboxylic acid/surfactant, and no-clean flux. A joining operation can be performed with this composition near the melting point of Sn, 230° C., where a metallurgical bonding of Sn-to-Sn or Sn-to-Au or Cu is accomplished at the particle-to-particle as well as particle-to-substrate pad or ball interfaces. Because of the metallurgical bonding, a higher electrical conductivity as well as a higher joint strength were demonstrated with the joints made of the new paste material than with those of the silver-filled epoxy material. The metallurgical bonds also provided a stable electrical conductivity of the new joints upon thermal exposure and cycling.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method of fabricating a socketable ball grid array assembly comprising the steps of:

applying an electrically conducting adhesive comprising a thermoplastic or thermosetting polymer resin matrix, no clean solder flux, and a plurality of electrically conducting particles with an electrically conductive and fusible coating with at least some of said particles being fused to other said particles through said electrically conductive fusible coating, on to terminal pads of a chip carrier module;

aligning and placing the module on an array of conducting spheres in a carrier boat;

bonding said spheres to the said terminal pads by means of the said conducting adhesive by applying heat and pressure for a time sufficient to facilitate melting of the said fusible coating and bonding of the said particles to themselves, to the said terminal pads and to the said spheres as well as curing of the said polymer resin to form a strong joint;

optionally cleaning the unjoined area of the said spheres to remove any residues;

and plugging the said array of spheres into matting sockets in a suitable printed wiring board.

2. A method according to claim 1, wherein the conducting spheres are made of at least one material selected from the group consisting of copper, nickel, iron, silver, gold and alloys thereof.

3. A method according to claim 2 wherein the said spheres are provided with a surface coating that is suitable for plug-in connections and for joining with said conducting adhesive material.

4. A method according to claim 3 wherein the said surface coating comprises a first material layer selected from the group consisting of nickel, cobalt, palladium, silver, platinum and mixtures thereof and a second material layer selected from the group consisting of gold, nickel, palladium, platinum, and mixtures thereof.

5. A method according to claim 4 wherein the said first and second material layers of the said coating have a thickness in the range from about 100 nm to about 10,000 nm.

6. A method according to claim 1 wherein the said polymer resin is selected from the group comprising polyimides, siloxanes, polyimide siloxanes, epoxies phenoxy polymers, styrene allyl alcohol polymers and biobased polymeric resins derived from at least one member of lignin, cellulose, wood oil, crop oil, and mixtures thereof.

7. A method according to claim 1 wherein the said conducting particles are made of a material selected from the group consisting of copper, silver, gold, nickel, and mixtures thereof.

8. A method according to claim 1 wherein the said fusible coating material is selected from the group consisting of tin, indium, bismuth, lead, antimony, zinc and alloys thereof.

9. A method according to claim 1, wherein the said conducting particles are about 1 to about 50 micrometers in diameter.

10. A method according to claim 1 wherein the fusible coating layer is about 0.1 to about 2 micrometers in thickness.

11. A method according to claim 1 wherein the said mating printing wiring board is selected from the group consisting of a second level packaging board for computing systems, a test socket board and a BGA module burn-in board.

12. A method according to claim 1 wherein the said plug-in connector in the printed wiring board is selected from the group consisting of a recessed contact pad, a metallized through hole, and a spring loaded socket.

13. A method according to claim 11 wherein the said plug-in sockets are coated with metal layers to facilitate reliable electrical contact by insertion of the said spheres.

14. A method according to claim 13 wherein the said coated metal layers comprise a first material selected form the group consisting of nickel, cobalt, palladium, silver, platinum and mixtures thereof and a second different material layer selected from the group consisting of gold, nickel, palladium, platinum, and mixtures thereof.

15. A method according to claim 14 wherein the said first and second material layers of the said coating have a thickness in the range from about 10 nm to about 10,000 nm.

16. A method according to claim 1 wherein the chip carrier module is selected from the group consisting of a metallized ceramic, multiplayer cofired ceramic, an organic film optionally provided with a rigid frame, and a section of a printed wiring board.

* * * * *

UNITED STATES PATENT AND TRADEMARK OFFICE
CERTIFICATE OF CORRECTION

PATENT NO. : 6,300,164 B1
DATED : October 9, 2001
INVENTOR(S) : Anson J. Call et al.

It is certified that error appears in the above-identified patent and that said Letters Patent is hereby corrected as shown below:

Column 2,
Line 33, change "90%Pb-37%Sn" to -- 90%Pb-10%Sn --.

Column 8,
Line 27, change "11" to -- 1 --.
Line 31, change "form" to -- from --.

Signed and Sealed this

Twenty-fifth Day of June, 2002

Attest:

JAMES E. ROGAN
Attesting Officer *Director of the United States Patent and Trademark Office*